United States Patent [19]
Ohshima

[11] Patent Number: 5,251,180
[45] Date of Patent: Oct. 5, 1993

[54] SEMICONDUCTOR MEMORY DEVICE

[75] Inventor: Shigeo Ohshima, Yokohama, Japan

[73] Assignee: Kabushiki Kaisha Toshiba, Kawasaki, Japan

[21] Appl. No.: 799,988

[22] Filed: Nov. 29, 1991

[30] Foreign Application Priority Data

Nov. 30, 1990 [JP] Japan .................. 2-336066

[51] Int. Cl.$^5$ .................................. G11C 11/407
[52] U.S. Cl. .................. 365/230.03; 365/194; 365/230.06
[58] Field of Search ............ 365/230.03, 194, 230.06, 365/206; 307/463, 530

[56] References Cited

U.S. PATENT DOCUMENTS

| | | | |
|---|---|---|---|
| 4,803,665 | 2/1989 | Kasa | 365/194 |
| 4,839,868 | 6/1989 | Sato et al. | 365/205 |
| 4,933,907 | 6/1990 | Kumanoya et al. | 365/230.03 |

FOREIGN PATENT DOCUMENTS 3916533 7/1990 Fed. Rep. of Germany .
63-282992 11/1988 Japan .

OTHER PUBLICATIONS

IBM Technical Disclosure Bulletin, vol. 33, No. 6B, Nov. 1990, N.Y., U.S., pp. 68-69; "Worldwide Sampling Technique for High Speed CMOS DRAMs".
IBM Technical Disclosure Bulletin, vol. 29, No. 6, Nov. 1986, N.Y., U.S., pp. 2650-2651, "Word Line Detector Circuit".

Primary Examiner—Eugene R. LaRoche
Assistant Examiner—Andrew Tran
Attorney, Agent, or Firm—Foley & Lardner

[57] ABSTRACT

In the semiconductor memory composed of divided dynamic memory cell arrays, when a drive signal is supplied to a word line selected by a row decoder, data stored at the memory cells connected to the word line are transferred to bit lines, respectively. A change in potential at the bit line pair is amplified by the sense amplifier to completely read the data. To prevent the bit line pairs from being sensed erroneously due to fluctuation of the timings at which the word line driving signals are generated in the divided cell arrays, a bit line sense signal is generated a predetermined delay time after all the word line driving signals have been generated, in order to drive all the sense amplifiers simultaneously, so that data can be definitely read from the memory cells to the bit lines. To detect that all the word line driving signals have been generated, a drive signal detection section is connected between word line driving circuits for all the divided cell arrays and a delay circuit connected to a sense amplifier driving circuit.

3 Claims, 5 Drawing Sheets

SEMICONDUCTOR MEMORY DEVICE

BACKGROUND OF THE INVENTION

The present invention relates to a semiconductor memory device, and more particularly to a semiconductor memory device which can prevent error caused when data are read from memory cells.

In the case of a semiconductor memory provided with dynamic memory cells, data stored in the memory cells are transferred to bit lines, in general after one word line has been selected on the basis of a row address and further voltage level at the word line has risen. Thereafter, a bit line sense amplifier corresponding to a column address becomes active to sense the bit lines, so that data are read from the memory cells.

In the above-mentioned dynamic memory, the word line driving circuit and bit line sense amplifier driving circuit are ordinarily arranged as peripheral blocks around the memory cells.

With the recent advance of a rapid increase in memory capacity, the length and the number of word lines through which read/write command signals are transmitted to the memory cells or bit lines through which signals read from the memory cells are transmitted increase more and more, with the result that the wiring resistance and load capacitance both increase. Therefore, there arise various problems in that the capability of the word line driving circuits relatively drops; the S/N ratio of the bit lines drops; the signals are delayed, etc.

To overcome these problems, it has been proposed that the memory cell areas be divided into several subareas. FIG. 1 shows an example thereof, in which the cell area on a memory chip is divided into 8 subareas so as to form a plurality of memory cell arrays 3a to 3h. Further, a row decoder, sense amplifier/column decoder, and a word line driving circuit are independently arranged for each memory cell array.

In FIG. 1, an address signal supplied from the outside is once stored in a row address buffer 1 and a column address buffer 2. The row address buffer 1 supplies a row address signal to the row decoders 4a to 4h of the respective memory cell arrays. In this case, if the outputs of the row decoders are the same, these row decoders can be used in common. The column address buffer 2 supplies a column address signal to the sense amplifier/column decoders 5a to 5h of the respective memory cell arrays.

FIG. 2 is a more detailed block diagram for assistance in explaining the operation of the memory cell arrays, in which n-piece memory cell arrays are arranged. A plurality of word line driving circuits 6a to 6n are arranged so as to correspond to the memory cell arrays 3a to 3n, respectively. The word line driving signals outputted from the circuits 6a to 6n are supplied to the word lines to activate these word lines themselves, respectively. Further, row decoders 4a to 4n for decoding a row address signal supplied from the row address buffer 1 are provided, respectively between the word line driving circuits 6a to 6n and the memory cell arrays 3a to 3n to select an address line to be driven by the row decoder.

As already described, since each bit line sense amplifier must be activated after the level of the selected word line has risen completely, the sense amplifier driving circuit 11 is activated being delayed by a predetermined delay time t1 through a delay circuit 10 after the word line driving circuit (e.g. 6a) has outputted a signal. The outputs of the sense amplifier driving circuit 11 are supplied to the sense amplifier/column decoders 5a to 5h of the respective arrays to drive the respective sense amplifiers. Here, the delay time t1 is determined long enough so that the operation of reading data to the bit lines can be completed after the level of the selected word line has risen.

FIG. 3 is a signal waveform diagram showing the relationship between the word line driving signal Wi, the sense amplifier driving signal SE, and the bit line potentials B, $\bar{B}$ when a data is read, in which the sense amplifier driving signal SE is outputted being delayed by a predetermined time period t1 after the word line driving signal Wi (solid curve) for selecting a word line has been generated.

When a word line driving signal is supplied to a word line selected by the row decoder, data stored at the memory cells connected to the word line are read to a pair of bit lines B and $\bar{B}$. Since the potential at the bit line pair change slightly, a change in potential at the bit line pair is amplified by the sense amplifier, so that data reading operation can be completed. The row decoders 4a to 4n, the word line driving circuits 6a to 6n, the delay circuit 10 and the sense amplifier driving circuit 11 constitute a word line control means 100, as shown in FIG. 2.

Where the memory area is divided as described above, since the lengths of the word line and the bit lines for each memory cell can be reduced, it is possible to decrease the wiring resistance and capacitance, so that the load capacitance of each of the word line driving circuits 6a to 6n can be decreased and therefore the access speed can be increased.

In the prior art memory device, however, when the power supply voltage $V_{CC}$ and the ground voltage $V_{SS}$ fluctuate on the semiconductor chip in various way due to the operation of the internal circuits of the memory device, the timing at which the output Wi of the word line driving circuit is generated also fluctuates as shown by dot-dashed or dot-dot-dashed lines in FIG. 3. Since the delay time t1 is determined by the delay circuit 10 on the assumption that the respective arrays are operated under a stable supply voltage, there exists a problem in that the word line driving circuit generates the output after the basic delay time determined by the delay circuit 10. In this case, since the time interval between when the word line driving output is generated (being delayed excessively) to when the sense amplifier driving output is generated is reduced less than the predetermined optimum time t1, so that an erroneous sensing operation occurs with respect to the bit lines, thus resulting in a serious problem in that the memory cell data to be refreshed are destroyed. This problem is particularly marked in the case of multiport memory or field memory including a great number of circuits operated without synchronism with the word line driving circuits.

SUMMARY OF THE INVENTION

Accordingly, the object of the present invention is to provide a semiconductor memory device which can prevent bit lines from being sensed erroneously even when the timings at which the respective outputs of the word line driving circuits are generated fluctuate due to the variation of supply voltage within the memory chip.

According to the present invention, there is provided a semiconductor memory device, comprising: a plurality of memory cell arrays in each of which dynamic memory cells are arranged in matrix form; a plurality of word line driving circuits provided for said memory cell arrays, respectively and arranged in a row direction of said memory cell arrays; a plurality of sense amplifiers for outputting logical level outputs to bit lines arranged in a column direction of each of said memory cell arrays; drive signal detecting means for obtaining a logical product of the outputs of said word line driving circuits; a delay circuit for delaying an output of said drive signal detecting means by a sufficient time during which said word lines are driven so that electric charges move from said corresponding memory cells to the bit lines and therefore potentials at the bit lines change slightly; and a sense amplifier driving circuit for driving said sense amplifiers in response to a signal outputted by said drive signal detecting means and delayed by said delay circuit.

According to the present invention, a bit line sense signal is outputted after it has been detected that the word line driving signals generated by a plurality of word line driving circuits provided for plural memory cells have all risen in level, respectively. The outputted sense signal is delayed by a predetermined time through a delay circuit, and supplied to a sense amplifier driving circuit to drive a group of sense amplifiers.

Consequently, in case the timings at which driving signals are generated by a plurality of word line driving circuits fluctuate due to noise superpose upon the supply voltage, the sense amplifiers are activated being delayed by the predetermined time on the basis of the last word line driving signal, after data have been read definitely from the memory cells of the respective cell arrays to the bit lines, thus preventing the erroneous sensing of bit lines.

BRIEF DESCRIPTION OF THE DRAWINGS

In the attached drawings.

DESCRIPTION OF THE PREFERRED EMBODIMENTS

Embodiments of the present invention will be described hereinbelow with reference to the attached drawings.

Figure 1:
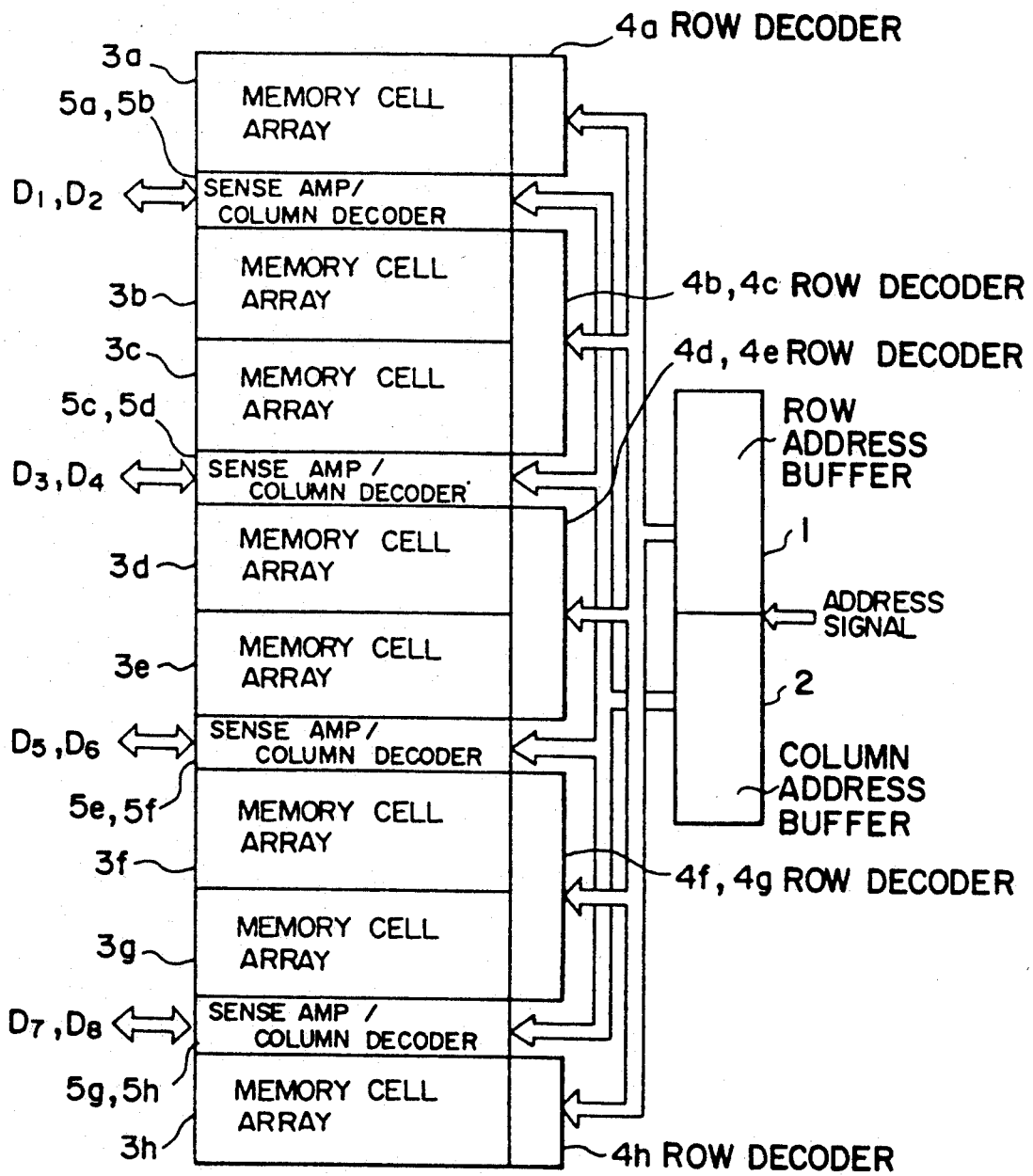
FIG. 1 is a block diagram showing an example of memory devices, in which the memory cell area on a memory chip is divided into a plurality of memory cell arrays.
Figure 2:
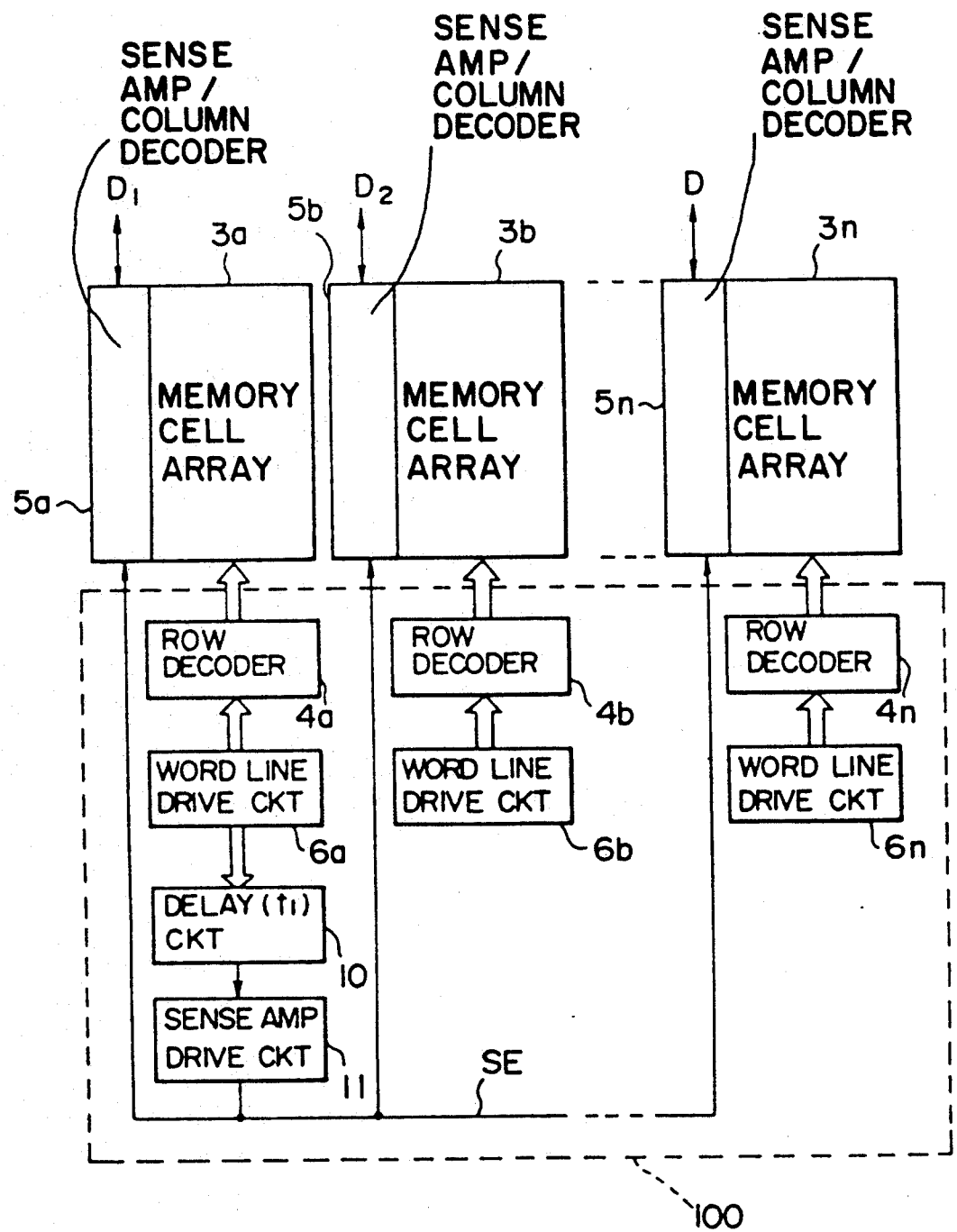
FIG. 2 is a block diagram showing a prior art word line control means.
Figure 4:
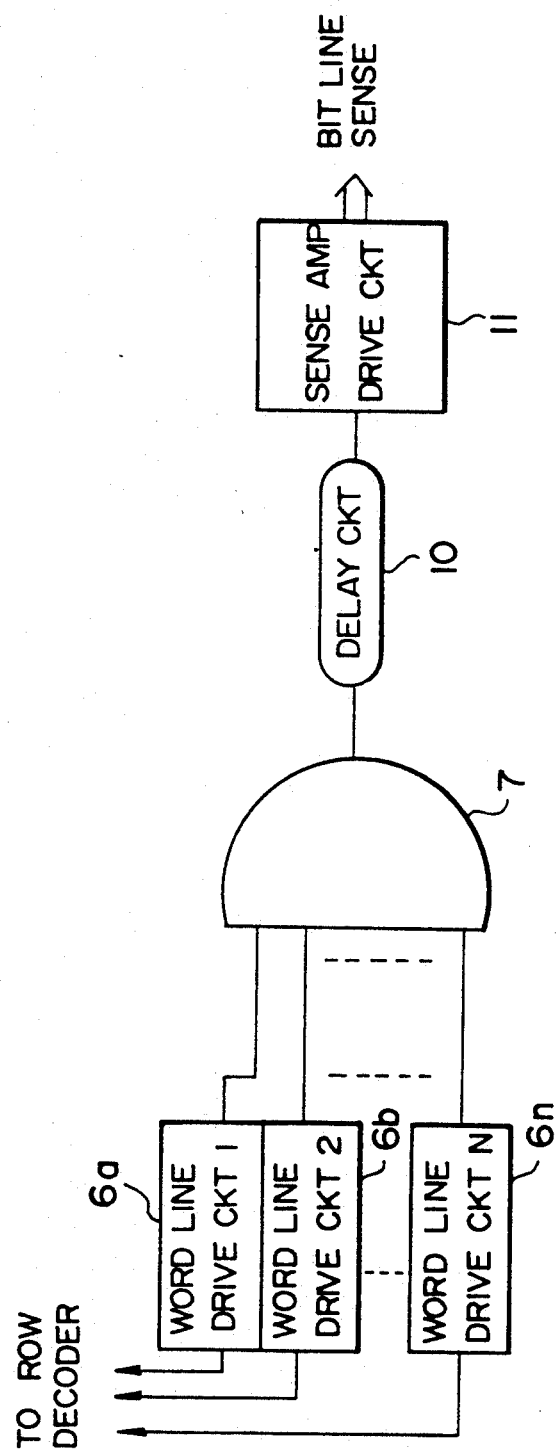
FIG. 4 is a block diagram showing the essential portion of an embodiment of the present invention.

FIG. 4 is a block diagram showing one embodiment of the present invention, which shows only the improved portion of the prior art word line control means 100 shown in FIG. 2. In FIG. 4, the same reference numerals as in FIG. 2 have been retained for similar elements which have the same functions, and without the detailed description thereof being duplicated.

Figure 3:
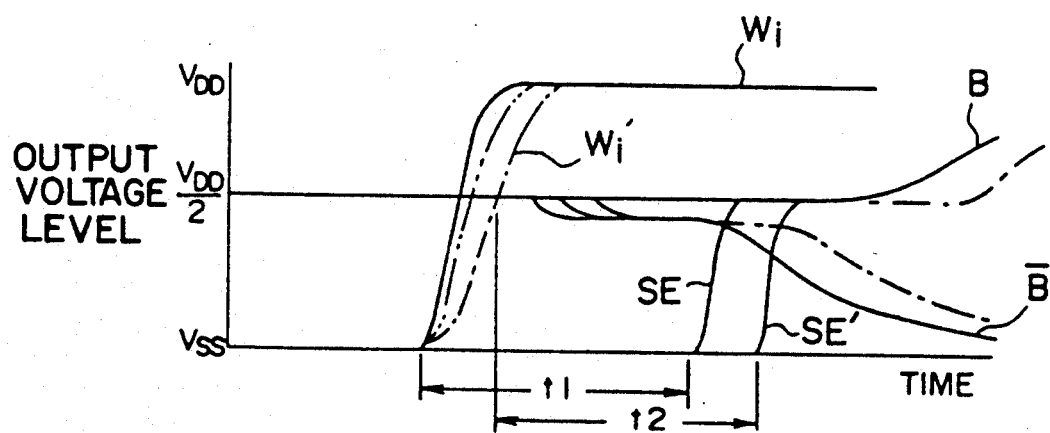
FIG. 3 is a signal waveform diagram for assistance in explaining the circuit operation thereof.

In FIG. 4, outputs of the respective word line driving circuits 6a to 6n are applied to the corresponding word lines via the row decoders, respectively and further inputted to an AND gate 7. Therefore, the AND gate 7 is drive signal detecting means for outputting a high level signal only when all the word line driving circuits 6a to 6n output driving signals, simultaneously. The output of this AND gate 7 is supplied to the delay circuit 10 as a detection signal. Further, in this embodiment, the threshold level of the AND gate 7 is so determined that an inverted detection signal is outputted from the AND gate when all the input signal levels thereof reach half ($V_{DD}/2$) of the supply voltage $V_{DD}$. A delay time t2 is determined by the delay circuit 10 in such a way as to provide a sufficient time during which an electric charge is moved from the memory cells Ci to the bit line pair after the word line has been activated and therefore the potential at the bit line pair changes slightly. This delay time t2 can be also set to t1. The delay circuit 10 activates the sense amplifier driving circuit 11 when the time t2 has elapsed after the AND gate 7 generated the output. The sense amplifier driving circuit 11 supplies a drive signal to the sense amplifier/column decoders 5a to 5n. The construction other than the above is the same as the prior art circuit shown in FIG. 2. Therefore, as shown in FIG. 3, after a time t2 has elapsed from the time when one of the word line driving circuits 6a to 6n generates the latest driving signal, the sense amplifiers 5a to 5n for the respective memory cell arrays are driven. Accordingly, in case the drive signals of the word line driving circuits fluctuate at the respective divided areas on a memory chip due to fluctuations in supply voltage, for instance, since the sense operation for the sense amplifiers starts in response to the latest read-out operation of data to the bit line pair, it is possible to prevent erroneous sensing operation to the sense amplifiers.

Figure 5:
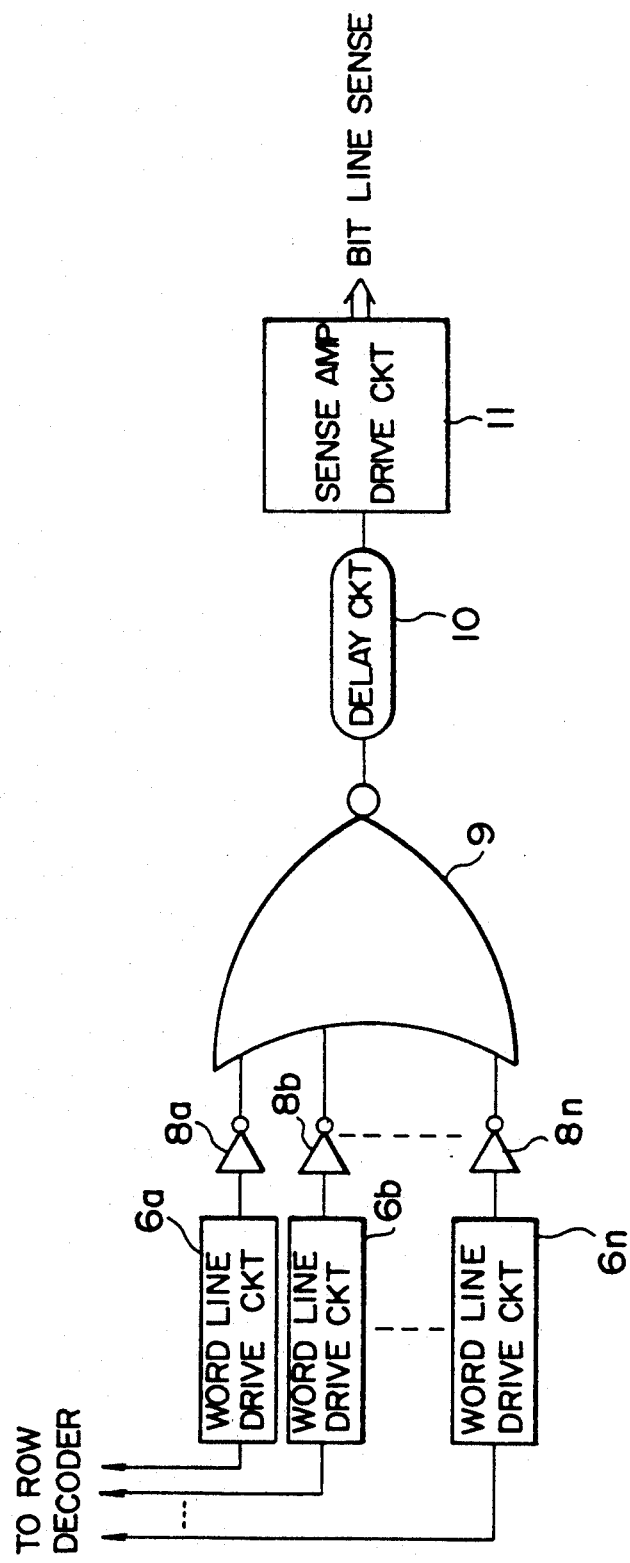
FIG. 5 is a block diagram showing the essential portion of another embodiment of the present invention.

FIG. 5 is a block diagram showing another embodiment of the word line control means 100, in which the outputs of the word line driving circuits 6a to 6n are applied to the input terminals of a NOR gate 9 via inverters 8a to 8n, respectively. The logic circuit as described above is equivalent to the simple AND gate, as understood in accordance with the De Morgan theorem.

In these embodiments, since the multiple input AND gate is incorporated, there exists an advantage such that it is possible to prevent the back gate bias effect caused when a number of transistors are connected in series.

As described above, in a semiconductor device according to the present invention, the sense amplifiers are operated after a predetermined time has elapsed after drive signals were outputted from all the word line driving circuits. In other words, the sense amplifiers are activated after a predetermined data read time from the memory cells to the bit line pair has elapsed on the basis of the drive signal outputted latest. Therefore, since the sense amplifiers start to operate after all signals held in the memory cells have been read to the bit line pairs, even if the timing at which the drive signals are generated fluctuates due to supply voltage noise, for instance, the possibility of occurrence of erroneous bit line sensing operation is extremely low, thus allowing a sufficient sense margin.

What is claimed is:
1. A semiconductor memory device, comprising:
a plurality of memory cell arrays in each of which dynamic memory cells are arranged in matrix form;
a plurality of word line driving circuits provided for said memory cell arrays, respectively and arranged in a row direction of said memory cell arrays;

a plurality of sense amplifiers for outputting logical level outputs to bit lines arranged in a column direction of each of said memory cell arrays;

drive signal detecting means for obtaining a logical product of the outputs of said word line driving circuits;

a delay circuit for delaying an output of said drive signal detecting means by a sufficient time during which said word lines are driven so that electric charges move from said corresponding memory cells to the bit lines and therefore potentials at the bit lines change slightly; and a sense amplifier driving circuit for driving said sense amplifiers in response to a signal outputted by said drive signal detecting means and delayed by said delay circuit.

2. The semiconductor memory device of claim 1, wherein said drive signal detecting means is an AND gate.

3. The semiconductor memory device of claim 1, wherein said drive signal detecting means is a NOR gate having inversion input terminals.

* * * * *